(12) United States Patent
Song

(10) Patent No.: US 7,226,814 B2
(45) Date of Patent: Jun. 5, 2007

(54) SEMICONDUCTOR PACKAGE DEVICE AND METHOD FOR FABRICATING THE SAME

(75) Inventor: Ho Uk Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/315,061

(22) Filed: Dec. 22, 2005

(65) Prior Publication Data

US 2006/0097408 A1 May 11, 2006

Related U.S. Application Data

(62) Division of application No. 10/655,206, filed on Sep. 4, 2003, now Pat. No. 6,998,720.

(30) Foreign Application Priority Data

May 24, 2003 (KR) ............................... 2003-33237

(51) Int. Cl.
*H01L 21/44* (2006.01)
(52) U.S. Cl. ................. 438/118; 257/E27.137
(58) Field of Classification Search .................... 438/6, 438/210, 104, 107–114, 118, 121–123, 128–129, 438/135, 142, 145, 149, 151, 157, 176, 478, 438/184, 193, 195–198, 200, 218, 237, 165, 438/294, 308, 337, 353, 378, 401
See application file for complete search history.

(56) References Cited

U.S. PATENT DOCUMENTS 6,689,637 B2 * 2/2004 Park .......................... 438/118
6,856,026 B2 * 2/2005 Yamada et al. ............. 257/774

* cited by examiner

*Primary Examiner*—Walter Lindsay, Jr.
*Assistant Examiner*—André Stevenson
(74) *Attorney, Agent, or Firm*—Ladas & Parry LLP

(57) ABSTRACT

Disclosed are a semiconductor package device and a method for fabricating the semiconductor package device. The semiconductor package has a semiconductor chip including a plurality of bonding pads having a microscopic size and aligned at a minute interval, a planar layer formed on the semiconductor chip so as to expose the bonding pads, metal patterns formed on the planar layer and having a size larger than a size of the bonding pads in such a manner that at least some parts of the metal patterns are connected to the bonding pads and a seed metal layer interposed between the planar layer and the metal patterns. When the bonding pads have microscopic size and aligned at a minute interval, a wire-bonding process is carried out by using the metal patterns having the size larger than the size of the bonding pads and covering the bonding pad region, as a connection part to the bonding pads. Thus, the bonding pad region is reduced by 50 to 80% so that the number of chips in the semiconductor chip is increased.

3 Claims, 5 Drawing Sheets

SEMICONDUCTOR PACKAGE DEVICE AND METHOD FOR FABRICATING THE SAME

BACKGROUND OF THE INVENTION

1. Field of the Invention

The present invention relates to a semiconductor package and a method for fabricating the same, and more particularly to a semiconductor package and a method for fabricating the same capable of minimizing a bonding pad area.

2. Description of the Prior Art

As generally known in the art, chips are formed on a wafer by performing a thin film growing process with respect to the wafer and are separated from each other by sawing the wafer. A shielding process or a molding process is carried out in order to prevent the chip from being contaminated by moisture and impurities. A lead for connecting the chip to an external circuit is attached to the chip so that a semiconductor chip package is completed.

Among semiconductor chip packages, chip-sized semiconductor packages, in which chips occupy most of the space in the semiconductor chip packages, are commercialized as micro devices. The chip-sized semiconductor packages can increase density on a circuit board and-integration degree of various integrated circuits, such as an ASIC (application specific integrated circuit).

FIG. 1 is a sectional view showing a conventional LOC (lead on chip) type semiconductor package.

As shown in FIG. 1, the conventional semiconductor package includes a substrate 12 having a contact hole (not shown) and a wire 15 for filling the contact hole, a semiconductor chip 10 having a plurality of bonding pad 11, an adhesive tape 14 interposed between the substrate 12 and the semiconductor chip 10, a bonding wire 13 for connecting the bonding pads 11 to one end of the wire 15, and a conductive ball (solder ball) 17 attached to the other end of the wire 15.

To fabricate the conventional semiconductor package having the above construction, the semiconductor chip 10 is first attached to an upper surface of the substrate 12 by using the adhesive tape 14. Then, the bonding pads 11 of the semiconductor chip 10 are electrically connected to the wire 15 of the substrate 12 through the bonding wire 13.

After that, the bonding wires 13 and the semiconductor chip 10 are covered with a molding member to prevent moisture and impurities from penetrating into the bonding wires 13 and the semiconductor chip 10. Then, the solder ball 17 is attached to the wire 15 of the substrate 12 so as to make an electric connection to an exterior, thereby completing the semiconductor package.

In a high-functional DRAM, such as a DDR or a DDR-2 which is an advanced memory device as compared with an SRAM, a chip has various functions, so it is required to increase a number of bonding pads. In addition, since there is a tendency to reduce a size of the chip, it is more required to fabricate the bonding pad in a microscopic size, so a packaging process including a wire-bonding step may become more difficult, thereby lowering the reliability of the packaging process.

SUMMARY OF THE INVENTION

Accordingly, the present invention has been made to solve the above-mentioned problems occurring in the prior art, and an object of the present invention is to provide a semiconductor package device and a method for fabricating the same capable of performing a packaging process even if bonding pads have a microscopic size.

In order to accomplish this object, there is provided a semiconductor package device comprising a semiconductor chip including a plurality of bonding pads having a microscopic size and aligned at a minute interval, a planar layer formed on the semiconductor chip so as to expose the bonding pads, metal patterns formed on the planar layer and having a size larger than a size of the bonding pads in such a manner that at least some parts of the metal patterns are connected to the bonding pads and a seed metal layer interposed between the planar layer and the metal patterns.

An oxide layer is interposed between the planar layer and the seed metal layer in order to release stress applied thereto.

A total thickness of the metal patterns and the seed metal layer is about 1 to 10 μm.

The seed metal layer has a triple stack structure including Ti—NiV—CU layers and the metal patterns include an Al—Ag alloy or a Cu—Ag alloy.

The bonding pads have a size of 10×10 μm in width and length.

The metal patterns are aligned in left and right directions or upward and downward directions about the bonding pads, or alternately aligned one by one in a zigzag manner in left and right directions or upward and downward directions about the bonding pads. If the metal patterns are alternately aligned, the metal patterns have a slightly inclined angle.

According to another embodiment of the present invention, there is provided a semiconductor package device comprising a semiconductor chip including a plurality of bonding pads having a microscopic size and aligned at a minute interval, a planar layer formed on the semiconductor chip and having an opening for exposing the bonding pads, a seed metal layer and metal patterns sequentially formed on the planar layer and having a size larger than a size of the bonding pads in such a manner that at least some parts of the seed metal layer and metal patterns are connected to the bonding pads and the seed metal layer and metal patterns are aligned in left and right directions or upward and downward directions about the bonding pads, and an oxide layer interposed between the planar layer and the seed metal layer in order to release stress applied thereto.

According to still another embodiment of the present invention, there is provided a semiconductor package device comprising a semiconductor chip including a plurality of bonding pads having a microscopic size and aligned at a minute interval, a planar layer formed on the semiconductor chip and having an opening for exposing the bonding pads, a seed metal layer and metal patterns sequentially formed on the planar layer and having a size larger than a size of the bonding pads in such a manner that at least some parts of the seed metal layer and metal patterns are connected to the bonding pads and the seed metal layer and metal patterns are alternately aligned one by one in a zigzag manner in left and right directions or upward and downward directions about the bonding pads, and an oxide layer interposed between the planar layer and the seed metal layer in order to release stress applied thereto.

The seed metal layer and metal patterns are alternately aligned while forming a slightly inclined angle.

According to another embodiment of the present invention, there is provided a method for fabricating a semiconductor package device, the method comprising the steps of providing a semiconductor chip including a plurality of bonding pads having a microscopic size and aligned at a minute interval, forming a planar layer on the semiconductor chip to expose the bonding pads, forming a seed metal layer on an entire surface of a substrate having the planar layer, forming solder resist patterns on the seed metal layer such that at least some parts of the solder resist pattern exposes the bonding pads, forming metal patterns for exposing the solder resist pattern while filling a gap formed between the solder resist patterns, removing the solder resist patterns, and etching the seed metal layer by using the metal pattern as a mask.

The present invention further comprises a step of interposing an oxide layer between the planar layer and the seed metal layer to release stress applied thereto.

The solder resist patterns are formed thicker than the metal patterns by 1 to 1.7 times.

The seed metal layer is formed by sequentially stacking Ti, NiV and Cu layers.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
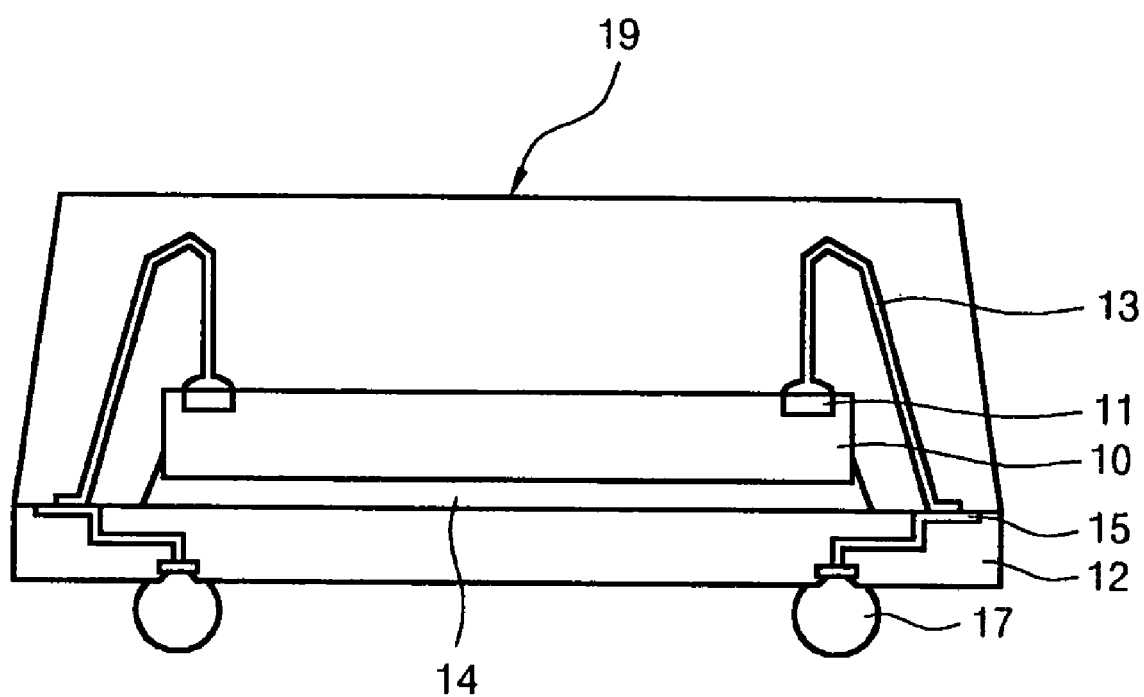
FIG. 1 is a view showing a conventional LOC type semiconductor package.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 2:
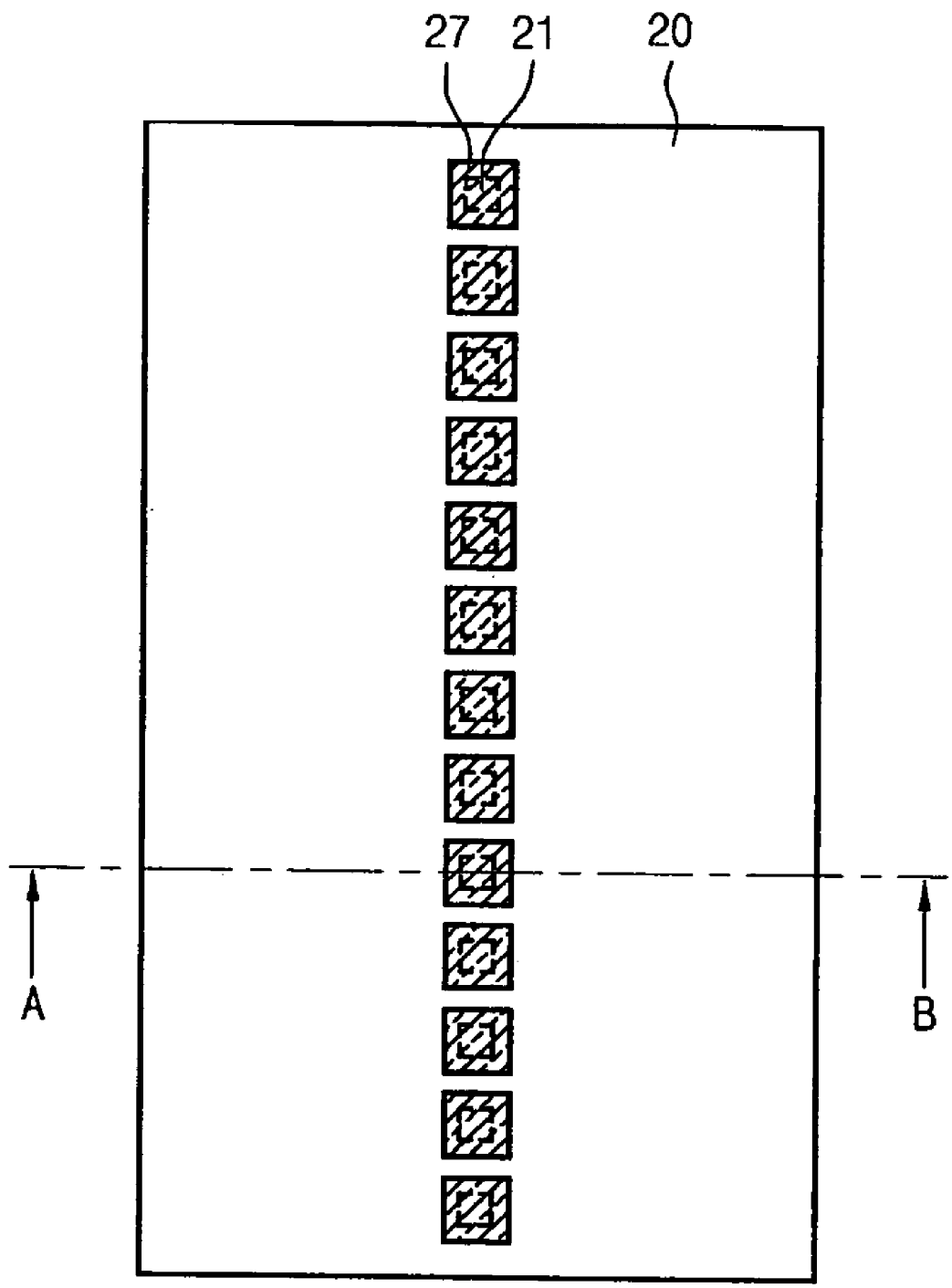
FIG. 2 is a plan view of a semiconductor package according to one embodiment of the present invention.
Figure 3:
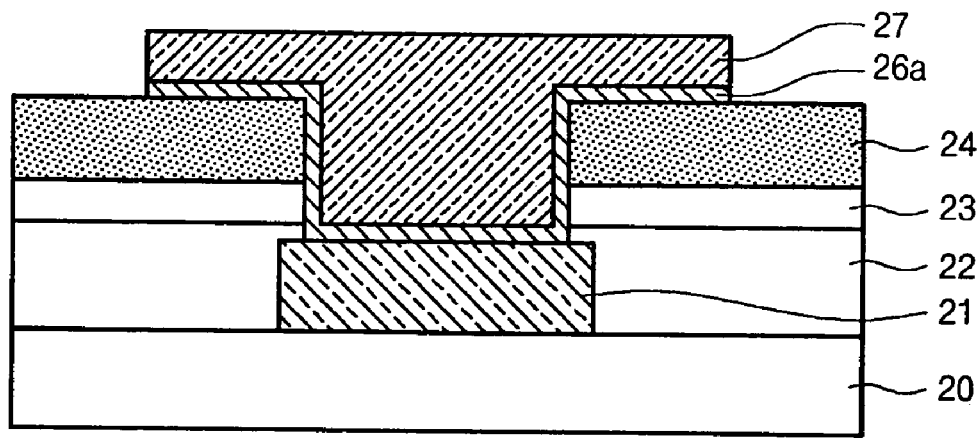
FIG. 3 is a sectional view taken along a line A–B shown in FIG. 2.

FIG. 2 is a plan view of a semiconductor package according to one embodiment of the present invention, and FIG. 3 is a sectional view taken along a line A-B shown in FIG. 2.

As shown in FIGS. 2 and 3, the semiconductor package of the present invention includes a semiconductor chip 20 having a plurality of bonding pads 21, which have a microscopic size and are aligned at a minute interval, first and second planar layers 22 and 23 formed on the semiconductor chip 20 in order to expose the bonding pads 21, a seed metal layer 26a and metal patterns 27, which are sequentially formed on the second planar layer 23 in such a manner that at least some parts of which cover a bonding pad region, and an oxide layer 24 interposed between the second planar layer 23 and the seed metal layer 26a so as to release stress applied thereto.

At least some parts of the metal patterns 27 are aligned in left and right directions and/or upward and downward directions about the bonding pads while covering the bonding pad region.

Figure 4A:
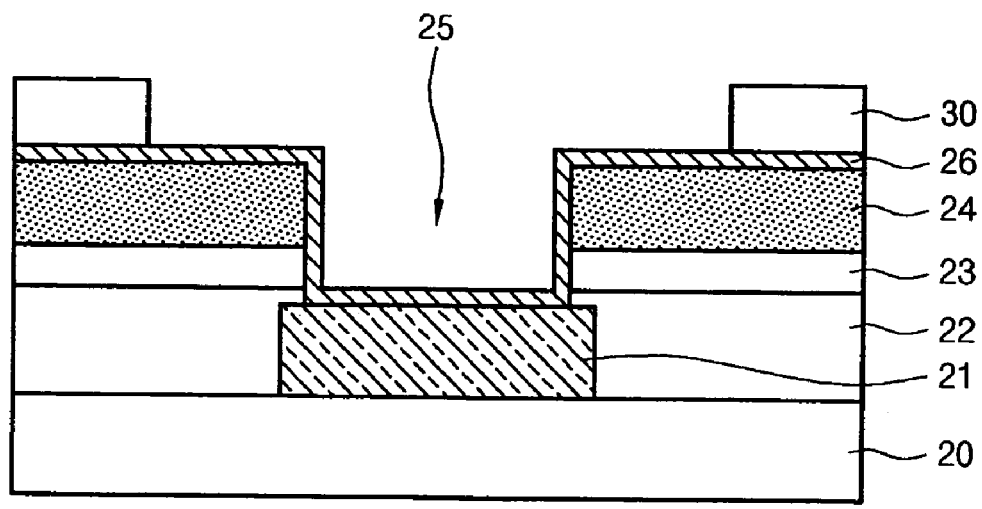
FIGS. 4A to 4C are sectional views showing a method for fabricating a semiconductor package according to one embodiment of the present invention.
Figure 4B:
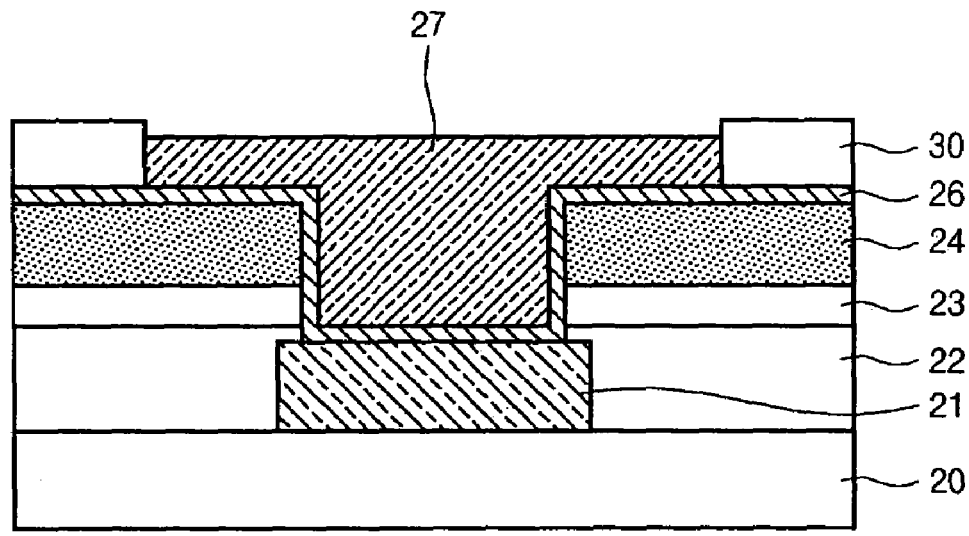
Figure 4C:
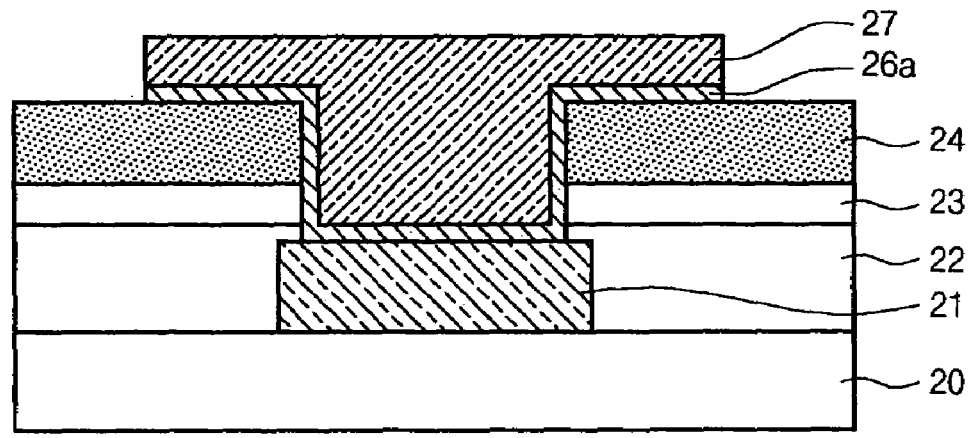

FIGS. 4A to 4C are sectional views showing a method for fabricating the semiconductor package according to one embodiment of the present invention.

As shown in FIG. 4A, to fabricate the semiconductor package having the above construction, the semiconductor chip 20 including the bonding pads 21 is firstly provided. At this time, the bonding pads having the microscopic size are aligned at a minute interval, which means that it is impossible to package the bonding pads 21 or to perform a probe test by using a conventional manner. For example, the bonding pads 21 have a size below 30×30 μm in width and length, preferably 10×10 μm. In addition, although the bonding pads 21 having a rectangular shape are illustrated in FIG. 3, the bonding pads 21 can be formed in other shapes, such as a circular shape.

Then, the first planar layer 22, the second planar layer 23 and the oxide layer 24 are sequentially formed on an entire surface of the semiconductor chip 20. After that, the second planar layer 23 and the oxide layer 24 are selectively etched to form an opening 25 for exposing the bonding pads 21. At this time, the oxide layer 24 releases stress caused by external impact. The oxide layer 24 is made of polyimide-based material.

Then, the seed metal layer 26 is formed on the entire surface of the substrate including the opening 25 through a sputtering process. At this time, the seed metal layer 26 is fabricated in a triple stack structure having Ti—NiV—Cu layers by using material having superior conductivity and adhesives characteristic.

Next, after coating a solder resist film (not shown) on the entire surface of the seed metal layer 26, exposure and development processes are carried out in order to form solder resist patterns 30 having a predetermined shape. At this time, the solder resist patterns 30 expose the bonding pads 21 and have a size larger than a size of the bonding pad region.

Then, as shown in FIG. 4B, a metal layer (not shown) including an Al—Ag alloy or a Cu—Ag alloy is deposited on the semiconductor chip having the solder resist patterns 30. After that, the metal layer is subject to an etching process until an upper surfaces of the solder resist patterns 30 are exposed, thereby forming metal patterns 27 filling a space formed between solder resist patterns. At this time, the solder resist patterns 30 are formed to be thicker than the metal patterns 27, about 1 to 1.7 times thicker.

In addition, the metal patterns 27 connected to a bonding wire (not shown) during the packaging process cover the bonding pads 21, so the metal patterns 27 have a size larger than a size of the bonding pads 210. The metal patterns 27 are aligned in left and right directions and/or upward and downward directions about the bonding pads 21.

Then, after removing the solder resist patterns, the seed metal layer is etched by using the metal patterns 27 as a mask as shown in FIG 4C. At this time, the total thickness of the metal patterns 27 and the remaining seed metal layer is about 1 to 10μm.

According to the present invention, the metal patterns covering the bonding pad region have a size larger a size of the bonding pads, so it is possible to carry out the packaging process including the wire-bonding process by using the metal patterns even if the bonding pads having a microscopic size are aligned at a minute interval from each other.

Figure 5:
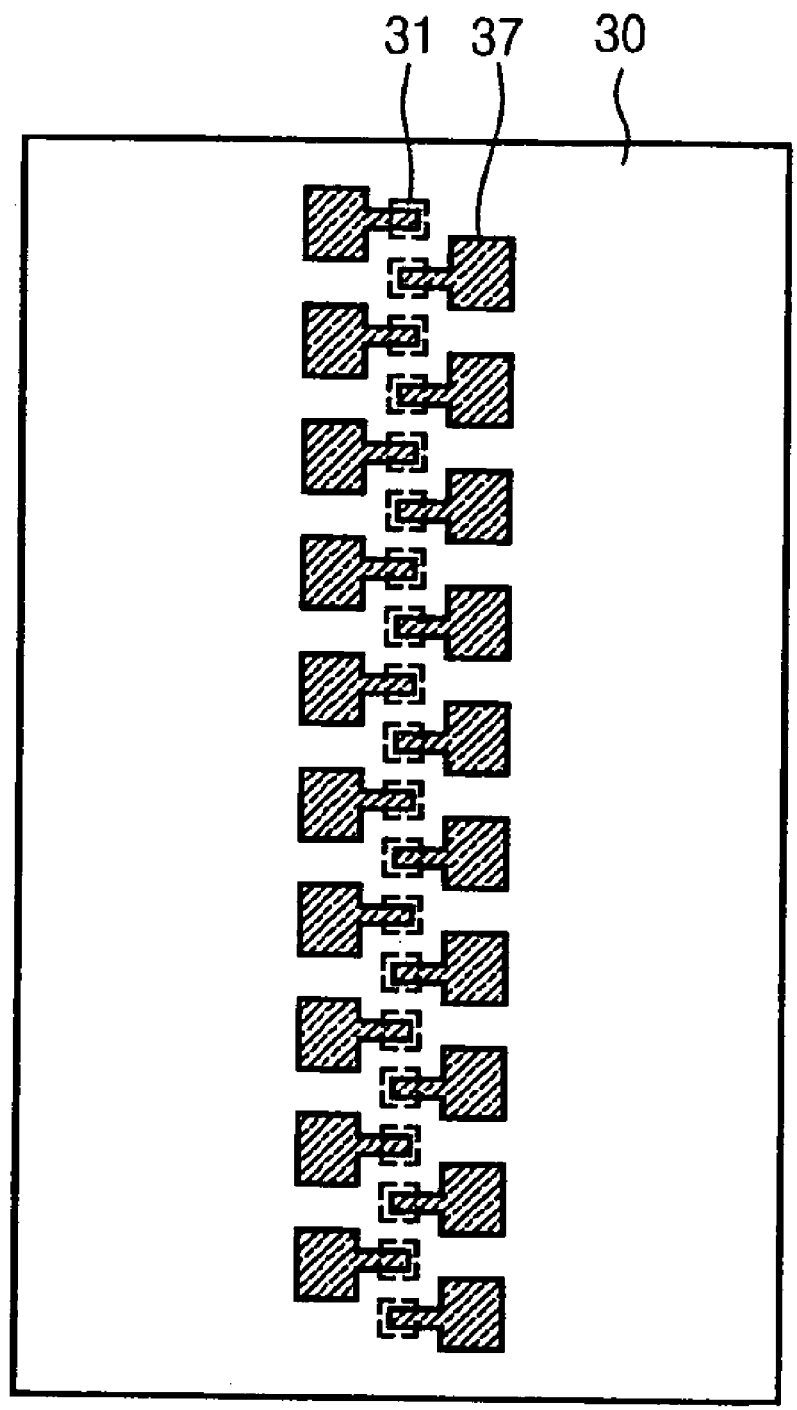
FIG. 5 is a plan view of a semiconductor package according to another embodiment of the present invention.

FIG. 5 is a plan view of a semiconductor package according to another embodiment of the present invention, where bonding pads 31 are alternately aligned one by one in a zigzag manner.

According to the present embodiment, at least some parts of metal patterns 37, which are connecting parts for the bonding pads 31, cover a bonding pad region and remaining parts of the metal patterns 37 are horizontally aligned in left and right directions or upward and downward directions about the bonding pads 31 in the zigzag manner, or aligned while forming a slightly inclined angle. Reference numeral 30 represents a semiconductor chip.

Therefore, according to the present invention, even if the bonding pads have a microscopic size and are aligned at a minute interval, it is possible to carry out the packaging process including the wire-bonding process with respect to the bonding pads by using the metal patterns having a size larger than a size of the bonding pads and covering the bonding pad region, or by using the metal patterns extending in a predetermined direction while covering the bonding pad region.

As described above, in the case that the packaging process is difficult or the workability is lowered due to the bonding pads having the microscopic size and aligned at the minute interval, the present invention can perform the packaging process including the wire-bonding process with respect to the bonding pads by using the metal patterns having the size larger than the size of the bonding pads and covering the bonding pad region, as a connection part to the bonding pads.

In addition, the present invention can perform the packaging process by using the metal patterns, which cover the bonding pad region and extends in a predetermined direction, as a connection part to the bonding pads.

Accordingly, the present invention can reduce the bonding pad region by 50 to 80% so that the number of chips in the semiconductor chip can be increased.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor package device, the method comprising the steps of:

providing a semiconductor chip including a plurality of bonding pads having a microscopic size and aligned at a minute interval;

forming a planar layer on the semiconductor chip to expose the bonding pads;

forming an oxide layer on the planar layer to release stress applied thereto;

forming a seed metal layer on an entire surface of a substrate having the oxide layer;

forming solder resist patterns on the seed metal layer such that at least some parts of the solder resist pattern exposes the bonding pads;

forming metal patterns for exposing the solder resist pattern while filling a gap formed between the solder resist patterns; removing the solder resist patterns; and etching the seed metal layer by using the metal pattern as a mask.

2. The method as claimed in claim 1, wherein the solder resist patterns are formed to be thicker than the metal patterns by 1 to 1.7 times.

3. The method as claimed in claim 1, wherein the seed metal layer is formed by sequentially stacking Ti, NiV and Cu layers.

* * * * *